(12) United States Patent
Hekmatshoartabari et al.

(10) Patent No.: US 9,680,045 B2
(45) Date of Patent: Jun. 13, 2017

(54) III-V SOLAR CELL STRUCTURE WITH MULTI-LAYER BACK SURFACE FIELD

(71) Applicant: International Business Machines Corporation, Armonk, NY (US)

(72) Inventors: Bahman Hekmatshoartabari, White Plains, NY (US); Ali Khakifirooz, Los Altos, CA (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/750,166

(22) Filed: Jun. 25, 2015

(65) Prior Publication Data
US 2016/0380143 A1 Dec. 29, 2016

(51) Int. Cl.
| | | |
|---|---|---|
| H01L 21/00 | (2006.01) | |
| H01L 31/0725 | (2012.01) | |
| H01L 31/0735 | (2012.01) | |
| H01L 31/0232 | (2014.01) | |
| H01L 31/18 | (2006.01) | |

(52) U.S. Cl.
CPC .... *H01L 31/0725* (2013.01); *H01L 31/02327* (2013.01); *H01L 31/0735* (2013.01); *H01L 31/1848* (2013.01)

(58) Field of Classification Search
CPC ............ H01L 31/0687; H01L 31/0725; H01L 31/1852; H01L 31/18; H01L 31/03046; H01L 31/022425; H01L 31/0735; H01L 21/02381; H01L 31/02327; H01L 31/1848
See application file for complete search history.

(56) References Cited

U.S. PATENT DOCUMENTS

| | | |
|---|---|---|
| 5,223,043 A | 6/1993 | Olson |
| 5,405,453 A | 4/1995 | Ho |
| 6,281,426 B1 | 8/2001 | Olson |
| 7,071,407 B2 | 7/2006 | Faterni |
| (Continued) | | |

FOREIGN PATENT DOCUMENTS

EP 2779253 9/2014

OTHER PUBLICATIONS

H. Kurita et al., High-Efficiency Monolithic InGaP/GaAs Tandem solar Cells with Improved Top-Cell Back-Surface-Field Layers, ThP39 Central Research Laboratories, Japan Energy Corporation, Indium Phosphide and Related Materials, 1995. Conference Proceedings., Seventh International Conference on, pp. 516-519, May 9-13, 1995.

(Continued)

*Primary Examiner* — Duy T Nguyen
(74) *Attorney, Agent, or Firm* — Louis J. Percello; Otterstedt, Ellenbogen & Kammer, LLP

(57) ABSTRACT

Photovoltaic devices including direct gap III-V absorber materials and operatively associated back structures enhance efficiency by enabling photon recycling. The back structures of the photovoltaic devices include wide bandgap III-V layers, highly doped (In)GaAs layers, patterned oxide layers and metal reflectors that directly contact the highly doped (In)GaAs layers through vias formed in the back structures. Localized ohmic contacts are formed in the back structures of the devices.

12 Claims, 4 Drawing Sheets

(56) References Cited

U.S. PATENT DOCUMENTS

| | | |
|---|---|---|
| 7,709,287 B2 | 5/2010 | Fatemi |
| 7,812,249 B2 | 10/2010 | King |
| 8,569,097 B1 | 10/2013 | Bedell |
| 8,912,071 B2 | 12/2014 | Hekmatshoartabari |
| 2004/0045598 A1* | 3/2004 | Narayanan ........ H01L 31/03046 136/255 |
| 2011/0005570 A1 | 1/2011 | Jain |
| 2011/0155231 A1 | 6/2011 | Chen |
| 2013/0014812 A1 | 1/2013 | Fisher |
| 2013/0213466 A1 | 8/2013 | Soga |
| 2014/0182667 A1* | 7/2014 | Richards ........... H01L 31/03523 136/255 |
| 2014/0261611 A1 | 9/2014 | King |
| 2015/0104899 A1 | 4/2015 | Ahmari |

OTHER PUBLICATIONS

Yablonovitch, Eli et al, The Opto-Electronics which Broke the Efficiency Record in Solar Cells, CLEO Technical Digest 2012, p. 1-2.

Yablonovitch, Eli et al., The Opto-Electronic Physics that Broke the Efficiency Limit in Solar Cells, IEEE, 2011, pp. 001556-001559.

Miller, Owen D., Strong Internal and External Luminescence as Solar Cells Approach the Shockley-Queisser Limit, IEEE Journal of Photovoltaics, vol. 2, No. 3, Jul. 2012, pp. 303-311.

\* cited by examiner

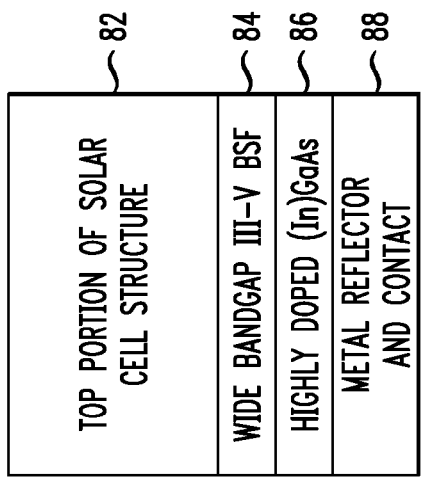
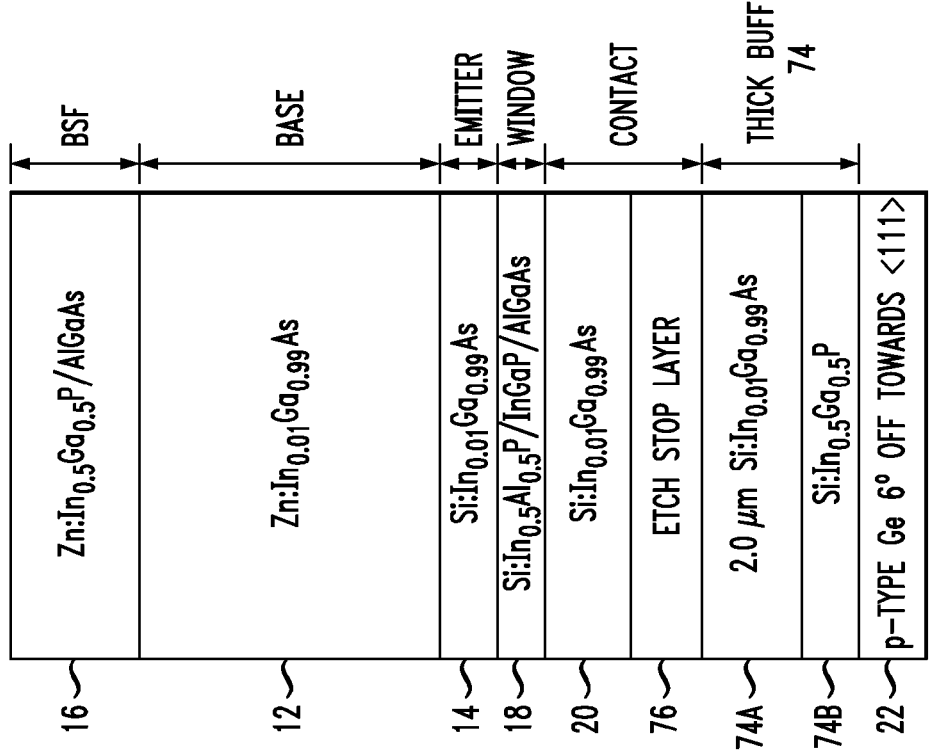

III-V SOLAR CELL STRUCTURE WITH MULTI-LAYER BACK SURFACE FIELD

FIELD

The present disclosure relates to the physical sciences, and, more particularly, to solar cell structures comprising III-V absorber material and the fabrication of such structures.

BACKGROUND

Direct gap III-V materials such as gallium arsenide are attractive candidates for making high efficiency solar cells due to their strong absorption properties. The fabrication of high efficiency III-V solar cells can be achieved by epitaxial growth of the structures using various techniques such as metal organic chemical vapor deposition and molecular beam epitaxy.

Referring to FIG. 1A, a conventional single junction III-V solar cell structure 10 is shown. This structure includes a base 12 positioned between an emitter layer 14 and a back surface field (BSF) layer 16. The base in the structure 10 is Zn:InGaAs, the emitter is Si:InGaAs and the BSF layer is Zn:InGaP. A window layer 18 and contact 20 are positioned above the emitter, the window layer being a ternary III-V material such as Si:$In_{0.5}Al_{0.5}P$ and the electrically conductive contact being Si:$In_{0.01}Ga_{0.99}As$. Ternary III-V materials help to minimize light absorption in the window layer. A p-type Ge substrate 22 oriented 6° towards <111> is positioned at the bottom of the structure 10. This conventional structure 10 requires the growth of a buffer region between the substrate and BSF layer 16. In this exemplary structure 10, the buffer is comprised of a Zn:$In_{0.01}Ga_{0.99}As$ layer 24A adjoining the BSF layer 16 and a Zn:$In_{0.5}Ga_{0.5}P$ layer 24B between and adjoining the top surface of the substrate 22 and the bottom surface of the top layer 24A of the buffer region 24. The buffer is provided in order to minimize antiphase boundaries (APB) defects that are formed while growing compound III-V materials on elemental substrates, such as germanium.

A conventional solar cell structure 30 including middle, top and bottom cells is shown in FIG. 1B and can be referred to as a tandem structure. In this exemplary structure 30, the middle cell is comprised of a p-Ga(In)As absorber layer or base 32, a n-Ga(In)As emitter layer 34 adjoining the top surface of the base 32, a window layer 36 adjoining the top surface of the emitter layer 34, and a BSF layer 38 adjoining the bottom surface of the base 32. The top cell is comprised of a p-GaInP base 40, an n-GaInP emitter layer 42, a window layer 44 and a BSF layer 46. A wide band gap tunnel junction 48 is provided between the top and middle cells. A germanium bottom cell includes a p-Ge base 50 and a n+Ge emitter layer 52. A n-Ga(In)As buffer 54 is positioned between the emitter layer 52 of the bottom cell and a second wide band gap tunnel junction 48 that adjoins the middle cell. A nucleation layer 53 is formed between the emitter layer 52 and buffer 54. Top and bottom electrical contacts 56, 58 allow the structure 30 to be electrically coupled to other devices. A n+Ga(In)As layer 60 is provided between the top contact 64 and the window layer 44 of the top cell. An antireflective coating 62 adjoins the window layer 44 of the top cell.

Solar cell structures can be initially grown in reverse order as shown in FIG. 2 to enhance functionality without performance degradation. In other words, the emitter layer may be provided near the bottom of the cell while the BSF layer is at or near the top. The solar cell structure 70 shown in FIG. 2 includes many of the same layers employed in the structure 10 shown in FIG. 1. The same reference numerals are employed to designate such layers. The buffer region 74 in the inverted structure 70 is doped with silicon as opposed to zinc. As indicated in the figure, the buffer layer 74A is formed of Si:$In_{0.01}Ga_{0.99}As$ and is 2.0 μm in thickness while the optional nucleation layer 74B is formed of Si:$In_{0.5}Ga_{0.5}P$. An etch stop layer 76 is formed between the ohmic contact layer 20 and the buffer layer 74A. A contact layer (not shown) may be provided on the BSF layer 16. The fabrication of a III-V solar cell structure such as shown in FIG. 2 involves growing the layers on a substrate, removing the germanium substrate 22 and the layers between the substrate and ohmic contact layer 20, none of which are part of the active device, and then further processing to produce a finished device. A metal lead (not shown) can then be formed on the contact layer 20.

FIG. 2B schematically illustrates an exemplary prior art photovoltaic structure 80 that includes a top portion 82 of a solar cell structure. As discussed above with respect to FIG. 1A, the top portion of a single junction solar cell structure includes an absorber layer, an emitter, a window layer, and a contact layer. In the case of a multi junction cell, the top portion would include an absorber layer, an emitter, a window layer, a tunnel junction, and the top sub-cells. The structure 80 further includes a wide bandgap III-V BSF layer 84, a highly doped (In)GaAs layer 86, and a metal reflector and contact 88. Wide bandgap materials such as InGaP, InAlP, InGaAlP and AlGaAs are widely used as a minority carrier mirror to form back surface fields in III-V solar cells. Because of the challenges associated with forming low resistivity ohmic contacts on wide bandgap materials, a highly doped layer of (In)GaAs with low indium content follows the deposition of the wide bandgap material to facilitate formation of the ohmic contact.

SUMMARY

Principles of the present disclosure provide techniques for fabricating photovoltaic devices. In accordance with an exemplary embodiment, a fabrication method includes obtaining a top portion of a solar cell structure, the top portion of the solar cell structure including an absorbing layer comprising a direct gap III-V material and an emitter layer on a first side of the absorbing layer. A wide bandgap III-V layer and a highly doped (In)GaAs layer are epitaxially deposited on a second side of the absorbing layer. An electrically insulating reflector layer is deposited on the second side of the absorbing layer and over the wide bandgap III-V layer and the highly doped (In)GaAs layer and later patterned. One of the wide bandgap III-V layer and the highly doped (In)GaAs layer is also patterned. A metal reflector layer is deposited on the second side of the absorbing layer such that the metal reflector layer directly contacts the highly doped (In)GaAs layer at a plurality of locations.

Photovoltaic devices are provided in accordance with further exemplary embodiments. In one such embodiment, a photovoltaic device includes a top structure including an absorbing layer comprising a direct gap III-V material and an emitter layer on a first side of the absorbing layer. A back structure is provided on the second side of the absorbing layer. The back structure includes a wide bandgap III-V layer, a highly doped (In)GaAs layer, a patterned, electrically insulating reflector layer, and a metal reflector. One of the wide bandgap III-V layer and the highly doped (In)GaAs layer is patterned. The patterned electrically insulating reflector layer is positioned between the metal reflector and the wide bandgap III-V layer. The metal reflector is in direct contact at a plurality of locations with the highly doped (In)GaAs layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

Techniques as disclosed herein can provide substantial beneficial technical effects. For example, one or more embodiments may provide one or more of the following advantages:

Photon recycling;
High solar cell efficiency (η);
Simplified back structure fabrication using single photolithography process.

These and other features and advantages of the present invention will become apparent from the following detailed description of illustrative embodiments thereof, which is to be read in connection with the accompanying drawings.

BRIEF DESCRIPTION OF THE DRAWINGS

FIG. 2A is a schematic illustration of a conventional solar cell structure having a single junction and wherein certain layers are grown in reverse order;

FIG. 2B is a schematic illustration of a conventional III-V solar cell structure having a wide bandgap BSF layer adjoining a heavily doped (In)GaAs layer;

DETAILED DESCRIPTION

Figure 1B:
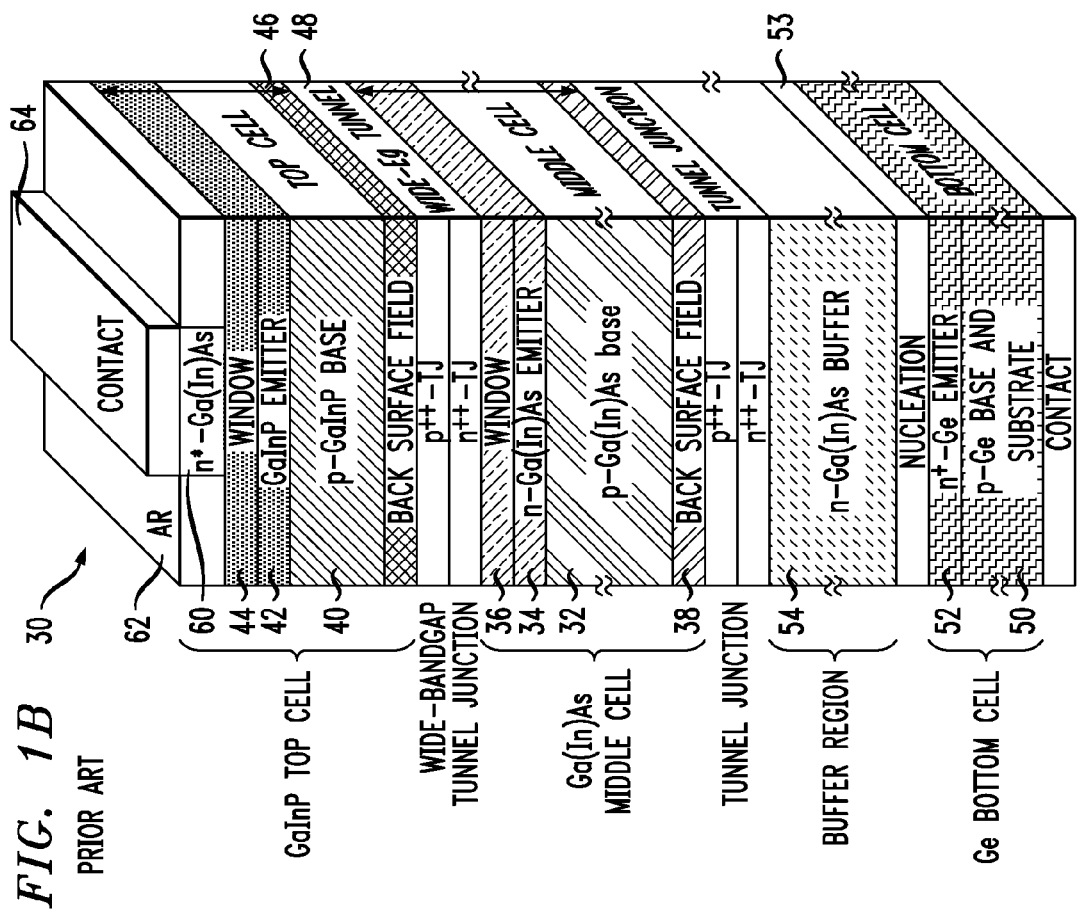
FIGS. 1A and 1B are schematic illustrations of conventional solar cell structures having p-type germanium substrates.
Figure 1A:
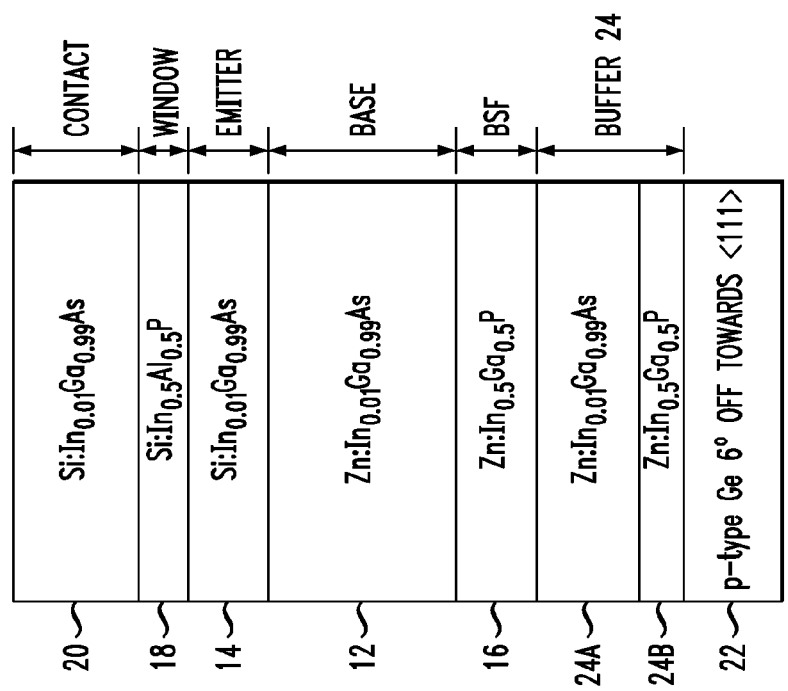

Direct bandgap III-V materials are attractive for making very high-efficiency photovoltaic solar cells primarily because of their strong absorption properties. This will therefore allow the majority of incident photons with an energy less than or equal to the bandgap of the III-V materials to be absorbed using thin layers. However, thin III-V solar cell structures are conventionally grown on thick GaAs or Ge substrates. This will in turn inhibit the mechanical flexibility of the solar cell while significantly contributing to the total weight of the cell and thus limiting the specific power. Therefore, the application of layer transfer techniques is important for realizing ultra-light flexible III-V solar cells. On the other hand, the possibility to access the rear of the cell by employing a layer transfer method enables the implementation of back reflectors in the solar cell structure. This feature will in principle permit the significant reduction of the thickness of the III-V absorber. In addition, direct gap III-V materials exhibit strong internal fluorescence. Therefore, the combination of this phenomenon coupled with the use of an effective back reflector offers unique opportunities for making very efficient solar cells by taking advantage of photon recycling. In the photon recycling phenomenon, radiative recombination is the primary recombination event in the absorber layer. Therefore, the energy of the emitter photon is equal to the bandgap of the absorber material. (In)GaAs is an optimal material in terms of bandgap to serve as either a stand-alone single junction or the bottom cell of a multi junction solar cell. A large portion of the emitted photons, as a result of the radiative recombination in the absorber layer, will be absorbed in a highly doped (In)GaAs contact layer. One solution is to reduce the thickness of the (In)GaAs contact layer. However, this will compromise the access series resistance.

In accordance with one exemplary embodiment disclosed herein, the above-referenced problem is addressed by patterning the heavily doped (In)GaAs layer to create isolated islands in order to form localized ohmic contact. The metal contact is separated from the widegap material by an oxide reflector in such embodiments. The fabrication process of such a back structure includes two photolithography steps: one for patterning the (In)GaAs contact layer and second for opening the oxide reflector in order to access the (In)GaAs islands.

In accordance with a further exemplary embodiment, a photovoltaic structure that enables photon recycling is provided. A simplified fabrication process is employed to create a double layer back surface field (BSF), whereby the first BSF layer is a hi-lo junction that is followed by a wide bandgap BSF layer. In order for implementation of the back reflector, an oxide back reflector is deposited and then the oxide reflector and wide bandgap BSF layer are sequentially etched to access the highly doped (In)GaAs BSF layer in order to form local back contacts. This process can be combined with a layer transfer process such as epitaxial layer lift-off or controlled spalling, for which the III-V structure may be grown in an inverted fashion (upside down) with the back reflector being the topmost layer prior to the layer transfer, while the solar cell structure will have the proper order for the layers after the layer transfer.

Exemplary solar cell structures in some exemplary embodiments include stacked layers in reverse order wherein a n++ (In)GaAs buffer layer plays dual roles as buffer and contact layers in the inverted structures. (The designation (In) signifies that the indium content is low (e.g. 1-3%) and that the InGaAs material is similar to GaAs.) The absorbing layers employed in such exemplary structures are III-V layers such as (In)GaAs. The stacked layers are grown on a germanium substrate in some embodiments. Controlled spalling may be employed as part of the fabrication process for some exemplary solar cell structures disclosed herein. The requirement for etching a buffer layer is eliminated, thereby facilitating the manufacturing process of devices using the disclosed structures.

Figure 3:
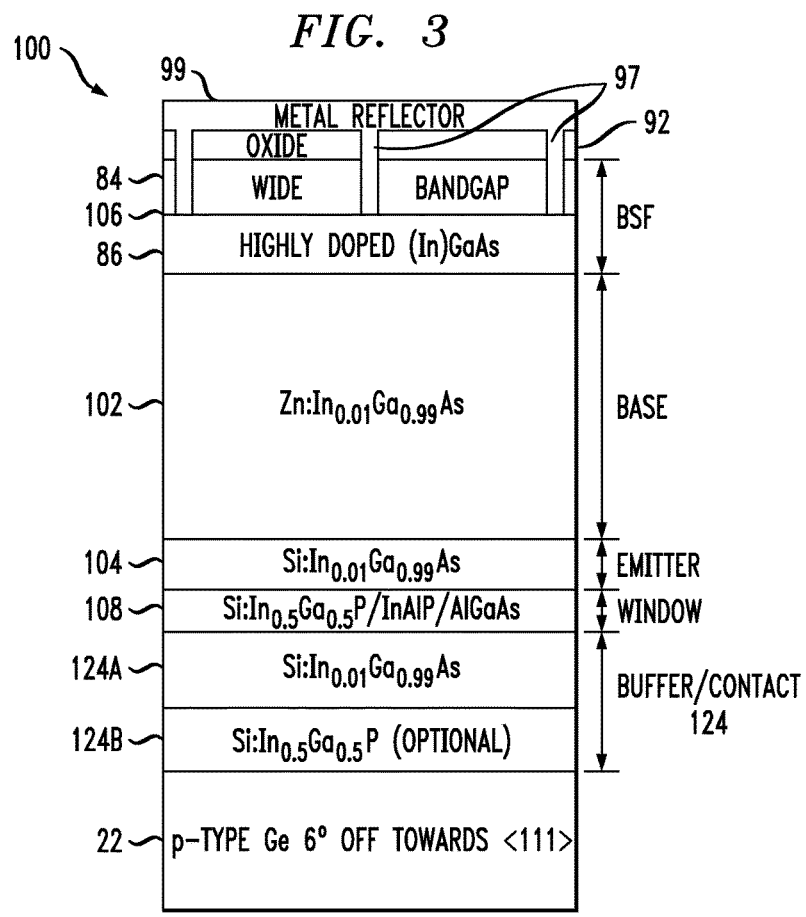
FIG. 3 is a schematic illustration of a flexible solar cell structure including a patterned oxide reflector in accordance with one exemplary embodiment.
Figure 5A:
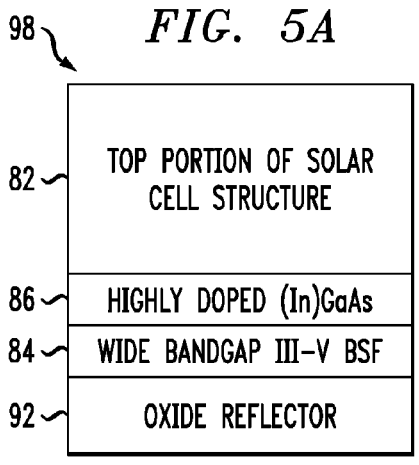
FIGS. 5A and 5B include schematic illustrations of exemplary fabrication steps for forming a photovoltaic device including patterned oxide and wide bandgap BSF layers.
Figure 5B:
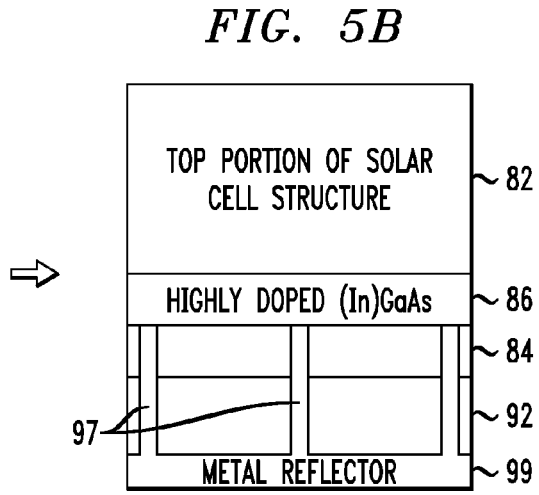

FIG. 3 shows a flexible solar cell structure 100 that can be produced by reverse order epitaxial growth followed by controlled spalling techniques such as disclosed in US Pub. Nos. 2010/0307572 and 2011/0048517, both of which are incorporated by reference herein. The structure 100 includes a light absorbing base layer 102 comprising a doped III-V material. In an exemplary embodiment, the base layer comprises $Zn:In_{0.01}Ga_{0.99}As$ and is 3 µm in thickness with a dopant level of 1E17. The emitter layer 104 and the BSF layer 106 are formed below and above the base layer, respectively. AlGaAs, InGaP and GaAs are among the materials that may comprise the emitter layer. In this exemplary embodiment, the emitter layer is a 500 Å $Si:In_{0.01}Ga_{0.99}As$ layer with a dopant level of 2E18. A NID: InGaAs layer may optionally be provided between the base layer 102 and emitter layer 104. The BSF layer 106 is a multi-layer structure including a wide bandgap layer 84 that may be comprised of III-V semiconductor materials such as InGaP, AlGaAs, InAlP, or InGaAlP and a highly doped (In)GaAs layer 86. The wide bandgap layer 84 is doped to the same conductivity type as the base material and the highly doped (In)GaAs layer 86. The doping is preferably as high as possible, noting that the doping efficiency in wide bandgap materials is generally low. Doping may be in the range of $10^{17}$ to $2\times10^{18}$ cm$^{-3}$ while thickness is 10-200 nm in one or more embodiments. As known in the art, wide bandgap semiconductor materials have bandgaps that significantly exceed the bandgap of silicon. The bandgap of the semiconductor material(s) used to form the wide bandgap layer 84 exceeds three electron volts (3 eV) in one or more exemplary embodiments. In one exemplary embodiment, the wide gap III-V layer 84 has a thickness of 100 nm and is formed from $In_{0.5}Ga_{0.5}P$. The highly doped (In)GaAs layer 86 is doped with zinc or carbon to form a p-type layer or tellurium or silicon to form an n-type layer. The doping level is preferably at least $10^{18}$ and typically in the range of $10^{18}$ to $10^{19}$ cm$^{-3}$. In the embodiments of FIGS. 3, 5A and 5B, the highly doped layer 86 is thinner than the diffusion length of the minority carriers therein. The minority carrier diffusion length in a material is a function of the doping in the material, as known in the art. Higher doping levels generally correspond to lower diffusion lengths. The thickness of the highly doped layer 86 is accordingly in the range of ten to one hundred nanometers (10-100 nm) in one or more embodiments. In contrast, the highly doped layer 86 of the prior art structure 80 shown in FIG. 2B is as thick as five hundred nanometers (500 nm).

An oxide layer 92 and a metal reflector layer 99 are formed on the BSF layer, for example a 50-200 nm thick oxide layer and a 100 nm-1 µm thick gold, silver or platinum layer. A window layer 108 adjoins the emitter layer and a n++ (In)GaAs buffer layer 124A. Suitable materials for the window layer 108 include InGaP, InAlP, InGaAlP and AlGaAs. The window layer in an exemplary structure 100 is formed of $Si:In_{0.5}Ga_{0.5}P$ and has a thickness of 25 nm. The active layers of the solar cell structure, namely the base 102, emitter layer 104, BSF layer 106 and window layer 108 are characterized by low defect density. In this exemplary embodiment, the highly doped (e.g. 1E18-1E19 dopant levels) contact layer 124A of the buffer region 124 formed on the substrate 22 is a $Si:In_{0.01}Ga_{0.99}As$ layer having a thickness of 0.5 µm and a dopant level of 3E18. Low defect density is not a requirement of the contact layer 124A, which is a passive element in the structure 100. This highly doped, electrically conductive layer 124A can be grown directly on the germanium substrate 22 and is capable of functioning as an ohmic contact layer with a metal layer (not shown) subsequently formed thereon as well as preventing antiphase defects that may otherwise occur if the active layers of the solar cell structure were grown directly on the germanium substrate 22. The indium concentration in the contact layer is low and should not exceed 2-3%. The buffer region 124 may further comprise an optional phosphide-based nucleation layer 124B ($Si:In_{0.5}Ga_{0.5}P$ in this exemplary embodiment) between the germanium substrate 122 and the buffer layer 124A. The optional layer 124B has a thickness of 185 Å in this embodiment and a dopant level of 1E18. Such an optional layer 124B is generally grown in upright triple junction solar cells to prevent arsenic (As) diffusion in germanium, as As diffuses faster than phosphorus. This is to obtain shallower p/n junctions in germanium for such triple-junction cells. For the inverted structure where germanium is only used as a handle substrate, the growth of this layer is not required. The substrate employed in this exemplary embodiment is p-type germanium 6° off towards <111>. In alternative embodiments, the germanium substrate could be p-type or n-type and 0-15° off from <111> or <110>. The structure 100 is relatively thin and flexible. Comparing the structure 100 to the structure 70 shown in FIG. 2A, the etch stop layer and relatively thick buffer region 74 are eliminated. As discussed below, the n++ (In)GaAs buffer layer 124A is used as an ohmic contact layer to which a metal layer can be applied during cell fabrication. Epitaxial methods known to those of skill in the art, including chemical vapor deposition such as MOCVD, can be employed for forming the layers of the structures disclosed herein on the germanium substrates 22.

Figure 4:
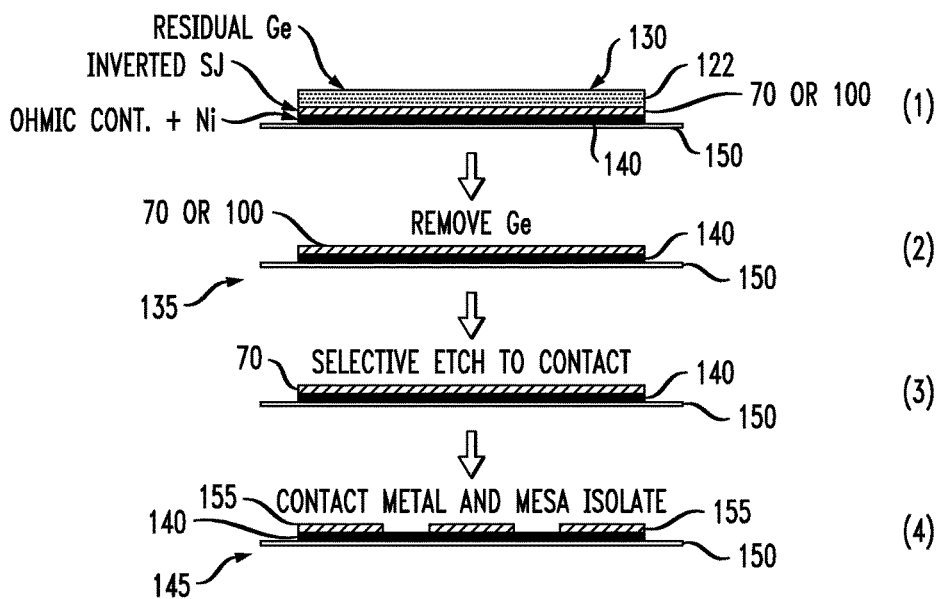
FIG. 4 is a schematic illustration of fabrication processes for making solar cell devices from solar cell structures as shown in FIG. 2A or 3.

FIG. 4 illustrates a fabrication process that shows certain benefits of employing the structure 100 as opposed to solar cell structures that include both buffer and ohmic contact layers such as the solar cell structure 70 discussed with respect to FIG. 2. Referring to the first step of the process, the starting structure 130 includes a layer 122 of residual germanium that may remain following spalling of the germanium substrate 22 on which the stacked, inverted layers of the structure 70 or 100 are formed. The structure 130 further includes a metal stressor layer 140 bonded to the stacked structure that can be made of nickel. This layer functions as a stressor layer. A flexible polymeric handle layer 150 such as a polyimide layer is adhered to the metal layer 140. Spalling is performed using the flexible handle layer 150 attached (e.g. bonded) to the metal (e.g. nickel) stressor layer 140. A fracture takes place under the buffer region at or below the interface of the buffer region with the germanium substrate 22. Following the spalling process, the resulting structure may include the layer 122 of residual germanium. The second illustrated step involves removal of the residual germanium layer 122 if present. This can be accomplished by chemical or physical etching. (The optional layer 124B, if used, would also be removed.) This step results in a structure 135 including the single junction stack comprising, for example, layers 102, 104, 106, 108, 110 as shown in FIG. 3, the ohmic contact layer comprising layers 124A, the metal layer 140, and the flexible layer 150. If the structure 100 shown in FIG. 3 is employed in this process, the third step illustrated in FIG. 4 is omitted as it is unnecessary. In contrast, if the structure 70 shown in FIG. 2A is further processed, the third step is necessary to remove layers 74A, 74B (if used), and the etch stop layer 76. The fourth illustrated step involves conventional front contact device fabrication. Contact metal is formed on the ohmic contact layer which comprises the buffer region 124, particularly layer 124A, if the structure 100 is employed. (If the structure 70 is employed, the contact metal is formed on the contact layer 20 following removal of the buffer 74 and etch stop layer 76 in the third illustrated step.) A mesa isolation process creates individual solar cell structures 155 from the structure 70 or 100, either of which may be wafer size. The resulting structure 145 can be diced and further processed as deemed necessary or appropriate.

FIGS. 5A and 5B illustrate the formation of the back structure that includes the layers 84, 86, 92 and 110 of the photovoltaic structure 100 shown in FIG. 3. As shown in FIG. 5A, layers of highly doped (In)GaAs, wide bandgap III-V semiconductor material and oxide reflector material are deposited on the top portion 82 of a solar cell structure. While the top portion 82 is shown at the top in FIG. 5A, it will actually be at the bottom of an inverted structure prior to layer transfer, such as the inverted structures 70 and 100 shown in FIGS. 2A and 3, respectively. The oxide reflector layer 92 is an electrically insulating layer such as silicon dioxide. Other wide gap electrically insulating materials such as zinc sulfide, magnesium fluoride, aluminum oxide ($Al_2O_3$), titanium dioxide, silicon nitride and hafnium oxide can alternatively function as reflectors. The oxide layer can be deposited using conventional methods such as electron beam evaporation or atomic-layer deposition (ALD). Once the structure 98 as shown in FIG. 5A is obtained, the oxide layer and the wide bandgap layer are sequentially etched to access the heavily doped (In)GaAs layer. A buffered oxide etch (BOE) can be used for etching oxide and other dielectric materials. An HCl etch can be used to etch wide gap III-V materials and will stop when reaching the highly doped (In)GaAs layer 86. Vias 97 extend through the oxide and wide bandgap III-V BSF layers 92, 84 down to the highly doped (In)GaAs layer 86 following the sequential etch processes. Following removal a patterned mask layer (not shown) on the reflector layer 92 used in forming the vias 97, a metal reflector layer 99 is deposited on the structure. The metal reflector layer fills the vias 97 and is electrically connected to the highly doped (In)GaAs layer 86 at a plurality of discrete locations. It further forms a surface layer covering the oxide reflector layer 92 as shown in FIG. 5B. In one or more embodiments, a reflective metal that is non-reactive with dielectric materials, such as platinum, gold, or silver, is employed. Such metals can be evaporated using known techniques generally categorized as physical vapor deposition (PVD), sputtered, or grown by atomic layer deposition (ALD) on the surface of the oxide layer and fills the trenches 97. In one or more embodiments, the thickness of the deposited metal layer 99 is between 100 nm-1 μm, although thinner or thicker layers may be used.

An alternative method and resulting structure are schematically illustrated in FIGS. 6A-6D. A structure 81 is obtained by growing a wide bandgap III-V BSF layer 84 on the top portion 82 of a solar cell structure and a heavily doped (In)GaAs layer 86 on the wide bandgap layer 84. As discussed above, the solar cell structure may be grown as an inverted structure on germanium. The (In)GaAs layer 86 is patterned using conventional photolithographic techniques to obtain the structure 83 shown schematically in FIG. 6B. Because the (In)GaAs layer 86 is patterned, the thickness requirements discussed above with respect to the embodiments of FIGS. 3, 5A and 5B do not apply. This layer may accordingly be any suitable thickness that will provide low access resistance. A layer thickness of 500 nm is employed in some embodiments. The thickness of the wide bandgap layer 84 is between 10-200 nm in one or more exemplary embodiments. The patterned (In)GaAs layer can be formed as isolated islands or as parallel rows having widths of between 300 μm and 2 mm in some embodiments. A reflector layer 92 is deposited on the exposed surfaces of the wide bandgap III-V BSF layer 84 and the patterned (In)GaAs layer to obtain the structure 85 shown in FIG. 6C. The reflector layer 92 may be silicon dioxide or other suitable dielectric material. A second photolithographic process is conducted to form openings 87 in the electrically insulating reflector layer 82 down to the patterned, highly doped (In)GaAs contact layer 86. A metal reflector layer 89 is deposited directly on the reflector layer 92 and fills the openings 87 therein. A localized ohmic contact structure is thereby obtained, as shown schematically in FIG. 6D. The (In)GaAs contact layer 86 has sufficient thickness to avoid materially compromising access series resistance. As the majority of the surface of the wide bandgap III-V layer 84 adjoins the reflector layer 92 rather than the heavily doped (In)GaAs contact layer 86, absorption by the contact layer 86 of emitted photons resulting from radiative recombination in the absorber layer is substantially reduced compared to back structures as described above with respect to FIG. 2B. The resulting device 91 is accordingly capable of taking advantage of radiative recombination in the direct-gap III-V absorber layer and enhancing efficiency.

Figure 6A:
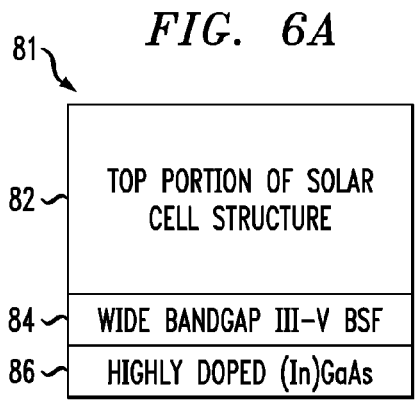
FIGS. 6A-6D is a schematic flow diagram illustrating the formation of a solar cell including patterned (In)GaAs and oxide layers.
Figure 6B:
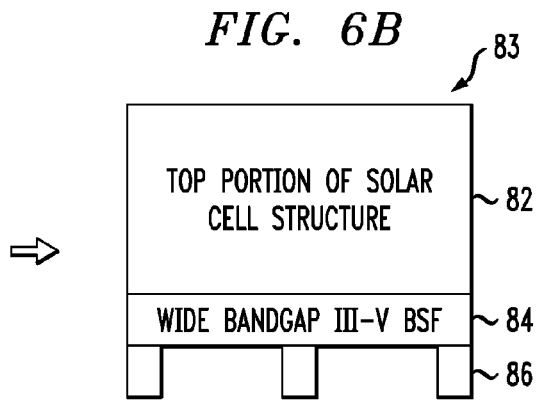
Figure 6C:
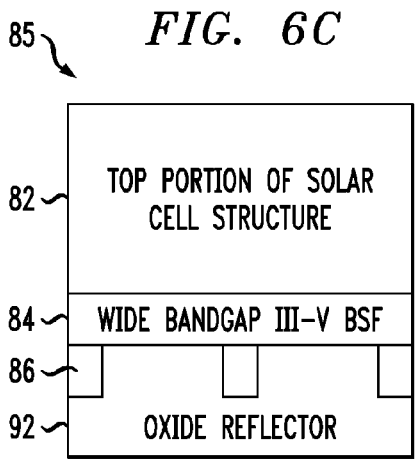
Figure 6D:
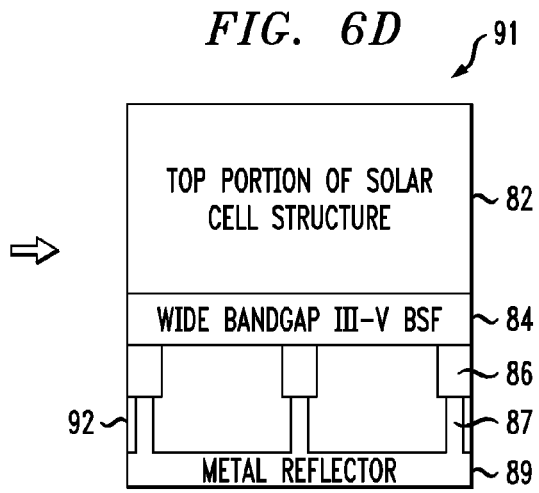

Given the discussion thus far, it will be appreciated that, in general terms, an exemplary method includes the steps of obtaining a top portion 82 of a solar cell structure, the top portion of the solar cell structure including an absorbing layer comprising a direct gap III-V material and an emitter layer on a first side of the absorbing layer. FIG. 3 shows one exemplary solar cell structure 100 including an absorbing layer (base 102) and an emitter 104 on a first side of the absorbing layer. As the structure is grown in an inverted order, the emitter is below the absorbing layer. The method further includes epitaxially depositing a wide bandgap III-V layer 84 and a highly doped (In)GaAs layer 86 on a second side of the absorbing layer. FIGS. 5A and 6A show structures 98, 81 including such deposited layers. An electrically insulating reflector layer 92 is deposited on the second side of the absorbing layer and over the wide bandgap III-V layer and the highly doped (In)GaAs layer. A further step in the method includes patterning the electrically insulating reflector layer prior to the deposition of a metal reflector. One of the wide bandgap III-V layer 84 and the highly doped (In)GaAs layer 86 is also patterned. The metal reflector layer is deposited on the second side of the absorbing layer such that it directly contacts the highly doped (In)GaAs layer at a plurality of locations, such as shown in FIGS. 5B and 6D. The electrically insulating reflector layer consists essentially of silicon dioxide in some embodiments. The top portion of the solar cell structure includes a single junction in some embodiments and multiple junctions in other embodiments. In some embodiments, the step of epitaxially depositing the wide bandgap III-V layer 84 and the highly doped (In)GaAs layer 86 on the second side of the absorbing layer further includes depositing the highly doped (In)GaAs layer directly on the top portion of the solar cell structure as shown in FIG.

5A and depositing the wide bandgap III-V layer over the highly doped (In)GaAs layer. The wide bandgap III-V layer is patterned to expose portions of the highly doped (In)GaAs layer as shown in FIG. 5B and FIG. 3. The highly doped (In)GaAs layer has a thickness smaller than the diffusion length of minority carriers in the highly doped (In)GaAs layer in one or more embodiments. In some embodiments, as exemplified in FIGS. 5A-5B, the wide bandgap III-V layer 84 is deposited directly on the highly doped (In)GaAs layer 86, the electrically insulating reflector layer 92 is deposited directly on the wide bandgap III-V layer 84, and the metal reflector layer 110 is deposited directly on the electrically insulating reflector layer 92 following sequential patterning of the electrically insulating reflector layer 92 and the wide bandgap III-V layer 84. In other embodiments, as exemplified in FIGS. 6A-6D, the wide bandgap III-V layer 84 is deposited directly on the top portion of the solar cell structure the highly doped (In)GaAs layer 86 is deposited over the wide bandgap III-V layer 84. In the embodiment of FIGS. 6A-6D, the highly doped (In)GaAs layer is patterned to expose portions of the wide bandgap III-V layer 84. The electrically insulating reflector layer 92 is deposited directly on both the wide bandgap III-V layer and the patterned, highly doped (In)GaAs layer in some embodiments, as shown in FIG. 6C. Isolated islands or parallel rows are formed from the highly doped (In)GaAs layer 86 in some embodiments, such as shown in FIG. 6B. The step of patterning the electrically insulating reflector layer 92 includes exposing the islands or parallel rows of the highly doped (In)GaAs layer in some embodiments, such as shown in FIG. 6D. The metal reflector 89 extends within the vias formed within the patterned layer 92 to make direct contact with the islands or rows of highly doped (In)GaAs material.

In accordance with a further aspect, a photovoltaic device is provided that comprises a top structure 82 including an absorbing layer comprising a direct gap III-V material and an emitter layer on a first side of the absorbing layer. A back structure on the second side of the absorbing layer includes a wide bandgap III-V layer 84, a highly doped (In)GaAs layer 86, a patterned oxide reflector layer 92, and a metal reflector. One of the wide bandgap III-V layer and the highly doped (In)GaAs layer is patterned. The patterned oxide reflector layer is positioned between the metal reflector and the wide bandgap III-V layer, as shown in FIGS. 5B and 6D. In some embodiments, the oxide reflector layer consists essentially of silicon dioxide. The metal reflector is in direct contact at a plurality of locations with the highly doped (In)GaAs layer, as shown in FIGS. 5B and 6D. In some embodiments, the highly doped (In)GaAs layer 86 is patterned and the wide bandgap III-V layer 84 is in direct contact with the top structure. The patterned, highly doped (In)GaAs layer comprises a plurality of isolated islands or parallel rows in some embodiments and the patterned oxide reflector layer comprises a plurality of vias extending to the islands or parallel rows, such as shown in FIG. 6D. The metal reflector 89 directly contacts the islands or rows as it extends through the vias. The wide bandgap III-V layer 84 is patterned and the highly doped (In)GaAs layer 86 is in direct contact with the top structure in some embodiments, as exemplified by the structure 100 shown in FIG. 3 as well as the photovoltaic device shown in FIG. 5B. The highly doped (In)GaAs layer 86 has a thickness smaller than the diffusion length of minority carriers in the highly doped (In)GaAs layer 86 in some exemplary embodiments, such as described above with respect to FIGS. 3 and 5B. Such a thickness contributes to the efficiency of the photovoltaic device by taking advantage of photon recycling. The layer has sufficient thickness to ensure acceptable low access resistance.

Those skilled in the art will appreciate that the exemplary structures discussed above can be distributed in raw form or incorporated as parts of intermediate products or end products that benefit from having photovoltaic elements therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   obtaining a top portion of a solar cell structure, the top portion of the solar cell structure including an absorbing layer comprising a direct gap III-V material and an emitter layer on a first side of the absorbing layer;
   epitaxially depositing a wide bandgap III-V layer and a highly doped (In)GaAs layer on a second side of the absorbing layer;
   depositing an electrically insulating reflector layer on the second side of the absorbing layer and over the wide bandgap III-V layer and the highly doped (In)GaAs layer;
   patterning the electrically insulating reflector layer;
   patterning one of the wide bandgap III-V layer and the highly doped (In)GaAs layer; and
   depositing a metal reflector layer on the second side of the absorbing layer such that the metal reflector layer directly contacts the highly doped (In)GaAs layer at a plurality of locations.

2. The method of claim 1, wherein the electrically insulating reflector layer includes silicon dioxide.

3. The method of claim 1, wherein the top portion of the solar cell structure further includes multiple junctions and a tunnel junction.

4. The method of claim 1, wherein the step of epitaxially depositing the wide bandgap III-V layer and the highly doped (In)GaAs layer on the second side of the absorbing layer further includes:

depositing the highly doped (In)GaAs layer directly on the top portion of the solar cell structure, and depositing the wide bandgap III-V layer over the highly doped (In)GaAs layer, and further wherein the step of patterning one of the wide bandgap III-V layer and the highly doped (In)GaAs layer includes patterning the wide bandgap III-V layer to expose portions of the highly doped (In)GaAs layer.

5. The method of claim 4, wherein the highly doped (In)GaAs layer has a thickness smaller than the diffusion length of minority carriers in the highly doped (In)GaAs layer.

6. The method of claim 5, wherein the electrically insulating reflector layer includes silicon dioxide.

7. The method of claim 5, wherein the wide bandgap III-V layer is deposited directly on the highly doped (In)GaAs layer, the electrically insulating reflector layer is deposited directly on the wide bandgap III-V layer, and the metal reflector layer is deposited directly on the electrically insulating reflector layer following sequential patterning of the electrically insulating reflector layer and the wide bandgap III-V layer.

8. The method of claim 5, wherein the highly doped (In)GaAs layer deposited on the second side of the absorbing layer has a final thickness between ten and one hundred nanometers.

9. The method of claim 1, wherein the step of epitaxially depositing the wide bandgap III-V layer and the highly doped (In)GaAs layer on the second side of the absorbing layer further includes:

depositing the wide bandgap III-V layer directly on the top portion of the solar cell structure, and depositing the highly doped (In)GaAs layer over the wide bandgap III-V layer, and further wherein the step of patterning one of the wide bandgap III-V layer and the highly doped (In)GaAs layer includes patterning the highly doped (In)GaAs layer to expose portions of the wide bandgap III-V layer.

10. The method of claim 9, wherein the step of depositing the electrically insulating reflector layer on the second side of the absorbing layer and over the wide bandgap III-V layer and the highly doped (In)GaAs layer further includes depositing the electrically insulating reflector layer directly on both the wide bandgap III-V layer and the patterned, highly doped (In)GaAs layer.

11. The method of claim 10, wherein the step of patterning the highly doped (In)GaAs layer to expose portions of the wide bandgap III-V layer further includes forming isolated islands or parallel rows from the highly doped (In)GaAs layer, and further wherein the step of patterning the electrically insulating reflector layer includes exposing the islands or parallel rows of the highly doped (In)GaAs layer.

12. The method of claim 11, wherein the electrically insulating reflector layer consists essentially of silicon dioxide.

* * * * *